United States Patent [19]

Yatsuo et al.

[11] 4,028,721
[45] June 7, 1977

[54] SEMICONDUCTOR CONTROLLED RECTIFIER DEVICE

[75] Inventors: Tsutomu Yatsuo; Katsumi Akabane, both of Hitachi, Japan

[73] Assignee: Hitachi, Ltd., Japan

[22] Filed: July 22, 1974

[21] Appl. No.: 490,300

[30] Foreign Application Priority Data

Aug. 1, 1973 Japan .............................. 48-85827
Aug. 31, 1973 Japan ............................ 48-97171

[52] U.S. Cl. .................................. 357/38; 357/20; 357/86
[51] Int. Cl.[2] ...................................... H01L 29/74
[58] Field of Search ......................... 357/20, 38, 86

[56] References Cited

UNITED STATES PATENTS

| | | | |
|---|---|---|---|
| 3,408,545 | 10/1968 | De Cecco et al. | 357/38 |
| 3,428,874 | 2/1969 | Gerlach | 357/38 |
| 3,440,501 | 4/1969 | Piccone et al. | 357/38 |
| 3,476,989 | 11/1969 | Miles et al. | 357/38 |
| 3,489,962 | 1/1970 | McIntyre et al. | 357/38 |
| 3,579,060 | 5/1971 | Davis | 357/38 |
| 3,622,845 | 11/1971 | McIntyre et al. | 357/38 |
| 3,783,350 | 1/1974 | Yatsuo et al. | 357/38 |
| 3,836,994 | 9/1974 | Piccone et al. | 357/38 |
| 3,914,783 | 10/1975 | Terasawa | 357/38 |

OTHER PUBLICATIONS

J. Garrett, "The Evolution of a High-Power Fast-Switching Thyristor," Electrical Engineer, vol. 48, No. 5, May 1971, pp. 33–35.

*Primary Examiner*—Michael L. Lynch
*Assistant Examiner*—Joseph E. Clawson, Jr.
*Attorney, Agent, or Firm*—Craig & Antonelli

[57] ABSTRACT

A semiconductor controlled rectifying device comprising a semiconductor substrate having four layers of PNPN, a couple of main electrodes in ohmic contact with the outside ones of the four layers respectively, a gate electrode provided on the intermediate P layer, an N-type minor region formed in the intermediate P layer in the vicinity of the gate electrode, and a conductor in contact with part of the outside N layer and with the minor region and disposed along the outer periphery of the outside N layer on the intermediate P layer.

3 Claims, 12 Drawing Figures

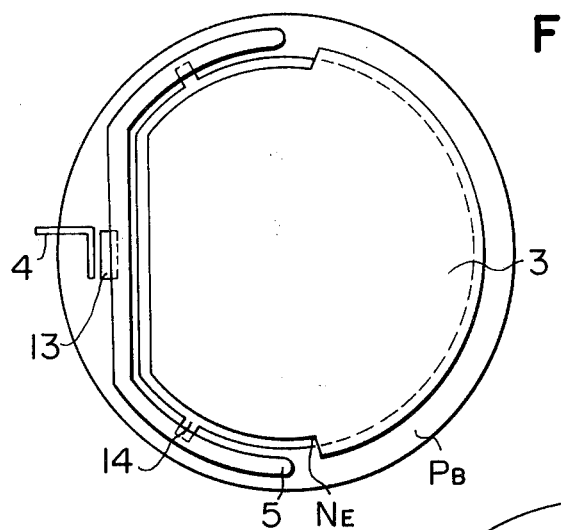
FIG. 6
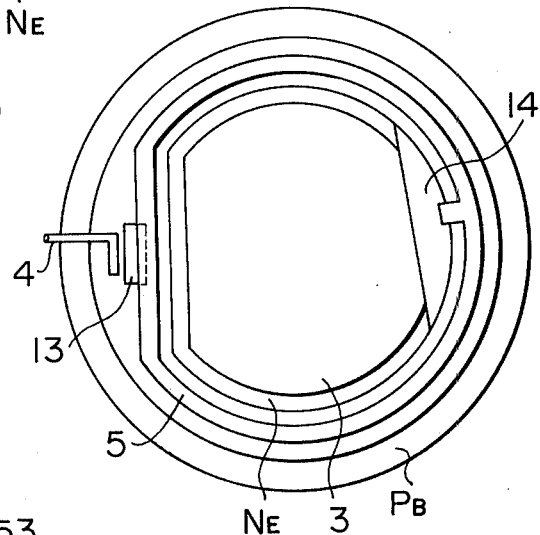
FIG. 7
FIG. 8
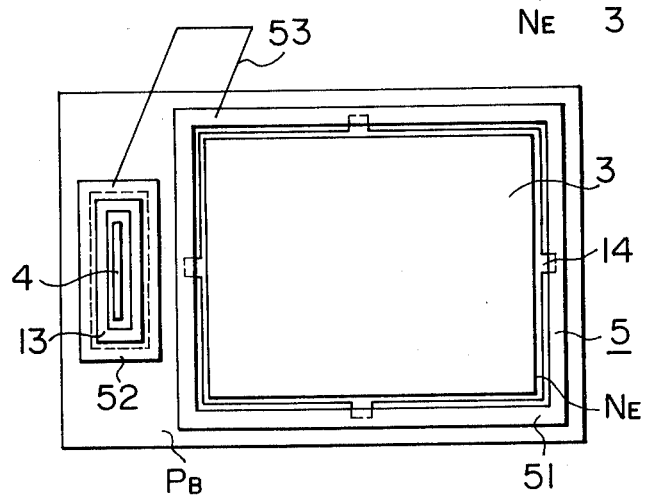

SEMICONDUCTOR CONTROLLED RECTIFIER DEVICE

The present invention relates to a semiconductor controlled rectifying device turned on by a gate signal.

Generally, a semiconductor controlled rectifying device turned ON by a gate signal from a gate electrode comprises a semiconductor substrate having four continuous layers of alternately different conductivities of PNPN, a couple of main electrodes in ohmic contact with the outside ones of the four layers and a gate electrode in contact with one of the layers of the semiconductor substrate. In such a semiconductor controlled rectifying device, when a gate current is made to flow between the main electrodes by applying a voltage between them in such a manner as to maintain a higher potential at one of the main electrodes than at the other while at the same time applying a gate signal in pulse form between the gate electrode and the other main electrode, a load current begins to flow between the main electrodes of the semiconductor controlled rectifying device which has thus far been cut off. When the cut-off semiconductor controlled rectifying device is put into a conductive state, the semiconductor controlled rectifying device is said to have been turned ON.

The turning ON of the semiconductor controlled rectifying device is accomplished in such a manner that a small area in the vicinity of the gate electrode is first turned ON by the gate current and with the lapse of time the turned-ON area extends over the whole device. If the current increasing rate $di/dt$ is high at the time of turning ON, the current density of the conductive portion which is limited to the small area in the vicinity of the gate electrode becomes excessive and the temperature at such an area rises abnormally, often leading to thermal destruction of the semiconductor controlled rectifying device. Various methods have so far been suggested to prevent thermal destruction by increasing the capability of the current increasing rate $di/dt$ of the device.

In one suggested method, the gate electrode is provided in annular form so as to facilitate initial conduction along the whole periphery of one of the outermost layers. This method, however, has the disadvantage that the gate current required for turning ON is unnecessarily increased. The most important factor required for a semiconductor controlled rectifying device is small current quickly turning ON a wide area. Well known devices considered to meet such a requirement include a semiconductor controlled rectifying device employing an amplifying gate system as shown in FIGS. 1a and 1b and the one employing a regenerative gate system as shown in FIGS. 2a and 2b. The amplifying gate system is characterized by the construction in which a minor region $N_0$ of the same conductivity as one of the outermost layers $N_E$ is formed in the part of intermediate layer $P_B$ located between the outermost layer $N_E$ and the gate electrode G, so that the minor region $N_0$ and the surface of the intermediate layer $P_B$ are electrically connected with each other by a conductor $M_1$ at the side of minor region $N_0$ farther from the gate electrode G. By this arrangement, the 4-layer region with the minor region $N_0$ as one of the outermost layers is first turned ON by the gate current from the gate electrode G and a load current flowing in the 4-layer region is used to turn ON the 4-layer region with the outermost layer $N_E$ as one of the outermost layers. By this method, a semiconductor controlled rectifying device is obtained in which initial conduction takes place quickly over a wide area by a small gate current.

The disadvantage of this amplifying gate system is that the semiconductor controlled rectifying device is liable to perform a malfunction when the voltage increasing rate $dV/dt$ or the temperature of the elements involved is high. In the semiconductor controlled rectifying device employing the amplifying gate system, the fact that the minor region $N_0$ and the conductor $M_1$ are formed on the intermediate layer $P_B$ results in a larger area of that portion of the intermediate layer $P_B$ which is not in contact with the outermost layer $N_E$. As a result, the displacement current and reverse leakage current generated at the portion in the device not in contact with the outermost layer $N_E$ is concentrated on the periphery of the outermost layer, so that a part of the periphery is liable to be turned ON. Further, the periphery of the outermost layer of the device with such a construction, which involves less shorted emitter than the center thereof to improve the gate sensitivity, is liable to be turned ON. This erroneous turning ON which occurs before application of gate current not only makes electrical circuit apparatus using the semiconductor controlled rectifying device uncontrollable but also destroys the semiconductor controlled rectifying device itself. In other words, the device of this type is such that the outermost layer is turned ON quickly over a wide area in the event that the minor area $N_0$ is first turned ON, but if part of the outermost layer is first turned ON, thermal destruction of the device results from the concentration of load current at the part first turned ON. The minor region $N_0$, which is connected to the intermediate layer $P_B$ by way of the conductor $M_1$, is hard to turn ON by displacement current or reverse leakage current. Instead, the erroneous turning ON usually occurs on the periphery of the outermost layer. Therefore, it will be understood that a semiconductor controlled rectifying device employing the amplifying gate system is liable to be broken by an erroneous turning ON due to displacement current or reverse leakage current.

Referring to the regenerative gate system, a protrusion $N_X$ which projects toward the gate electrode G and is out of contact with the main electrode K is incorporated in the outermost layer $N_E$, and a given portion of the protrusion is connected electrically by the conductor $M_2$ to that part of the intermediate layer $P_B$ which faces the outermost layer $N_E$. Gate current from the gate electrode G causes the protrusion $N_X$ to be first turned ON, and the resulting load current causes a potential difference between the main electrode K and that portion of the protrusion $N_X$ which is in contact with the conductor $M_2$ to be applied, through the conductor $M_2$, between the main electrode K and that portion of the intermediate layer $P_B$ which is in contact with the conductor $M_2$ thereby to turn ON the outermost layer facing the conductor $M_2$. Even this regenerative gate system has the disadvantage that part of the current generated by the turning ON of the protrusion $N_X$ flows directly into the outermost layer $N_E$ through the connection of the protrusion $N_X$ and the outermost layer $N_E$ and therefore does not contribute to the turning ON of the outermost layer, thus requiring a great amount of load current to flow in the protrusion $N_X$ until the main thyristor and its vicinity have been completely turned ON. Therefore, in order to prevent temperature rise by reducing the current density in such a portion, it is necessary to lengthen the opposed sides of the protrusion $N_X$ and the gate electrode G as shown in the drawing thereby to enlarge the initial turn-on area due to gate current from the gate electrode. However, even if the protrusion $N_X$ is formed in the shape of T and the corresponding portion of gate electrode G is lengthened as shown in the drawing, some part of the protrusion $N_X$ opposed to the gate electrode G is more liable to be turned ON than others in response to the same gate current, thus making it difficult to turn ON at the same time the entire portions of the protrusion opposed to the gate electrode with a small gate current. The result is the need for an excessively large switching power due to the high current density occurring in the protrusion in the initial stage of turning ON, thereby leading to the thermal destruction of the device. To prevent this phenomenon, the turning-on uniformity must be achieved by enlarging the gate current as far as possible. This disadvantage of the regenerative gate system is attributable, as already noted above, to the fact that the protrusion is connected to the outermost layer.

An object of the present invention is to provide a novel semiconductor controlled rectifying device in which a large area is capable of being turned ON with a small gate current.

Another object of the present invention is to provide a novel semiconductor controlled rectifying device in which the capability of the current increasing rate $di/dt$ is high at the time of turning ON.

Still another object of the present invention is to provide a novel semiconductor controlled rectifying device in which the capability of the voltage increasing rate $dV/dt$ and the capability to withstand high temperatures are high.

A further object of the invention is to provide a novel and reliable semiconductor controlled rectifying device.

In order to achieve the above-mentioned objects, the semiconductor controlled rectifying device according to the present invention is characterized by at least four continuous layers of PNPH, by a minor region formed in spaced relationship with one of the outermost layers in such a manner as to be in contact with an intermediate layer adjacent to the outermost layer and having the same conductivity as the outermost layer, by a conductor formed on the surface of the intermediate layer which is opposed to the outermost layer and in contact with both the minor region and part of the outermost layer, and by the turning ON with gate means of the 4-layer region with the minor region as the outermost layer.

The above and other objects, features and advantages will be made apparent by the detailed description taken in conjunction with the accompanying drawings, in which.

Figure 5A:
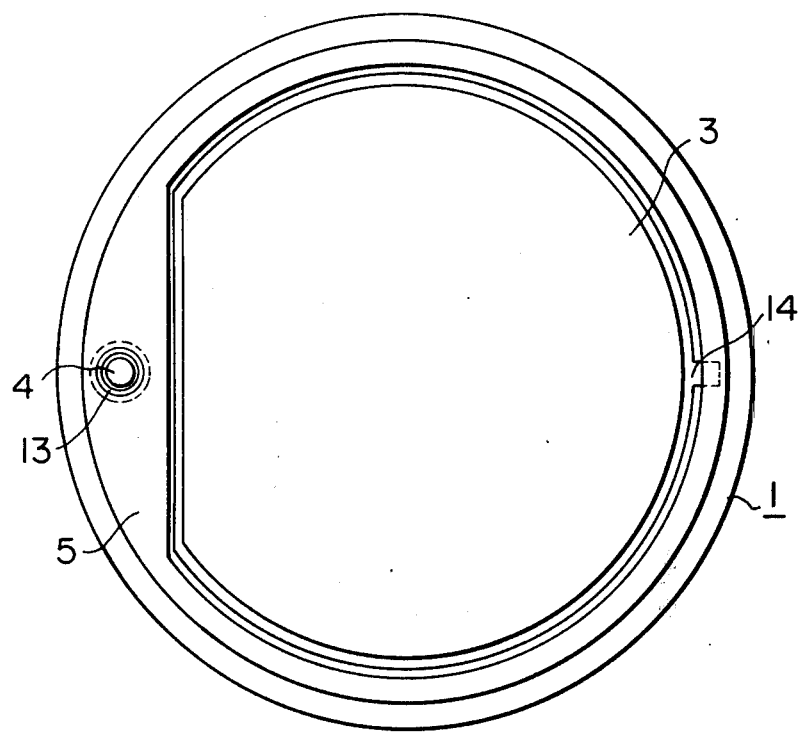
Figure 5B:
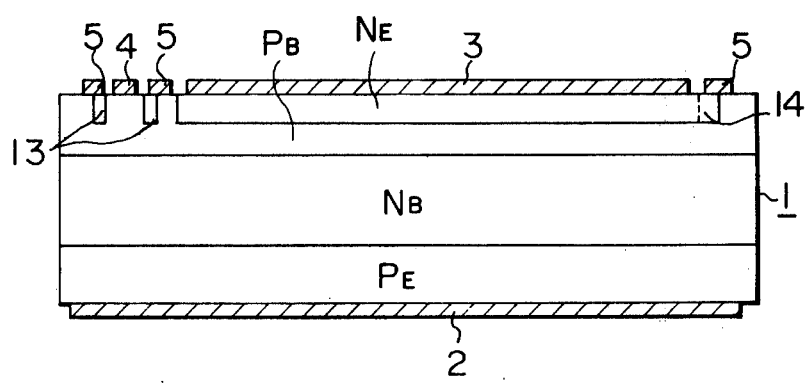

FIGS. 5a and 5b a plan view and a sectional view respectively showing a third embodiment of the invention;

FIG. 6 is a plan view showing a fourth embodiment of the invention;

FIG. 7 is a plan view showing a fifth embodiment of the invention; and

FIG. 8 is a plan view showing a sixth embodiment of the invention.

The present invention will be described below with reference to the accompanying drawings showing the embodiments.

Figure 3A:
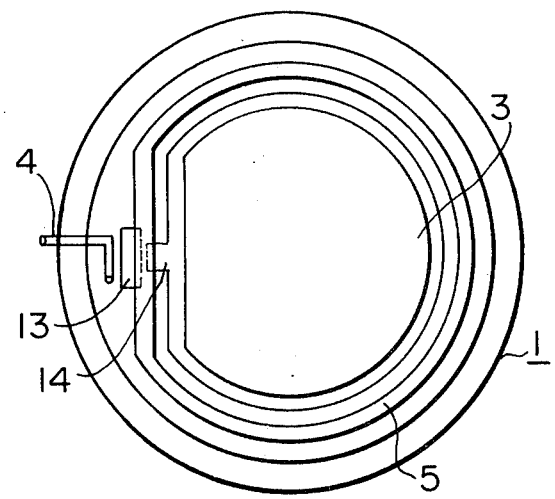
FIGS. 3a and 3b are a plan view and a sectional view respectively showing a first embodiment of the invention.
Figure 3B:
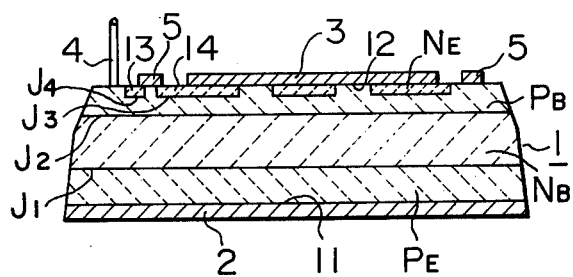

Referring first to FIGS. 3a and 3b illustrating the semiconductor controlled rectifying device according to a first embodiment of the invention, reference numeral 1 generally shows a semiconductor substrate having four layers $P_E$, $N_B$, $P_B$ and $N_E$ of alternately different conductivities between a couple of oppositely placed main surfaces 11 and 12. $P_E$ is an emitter layer of P-type conductivity (hereinafter referred to as the $P_E$ layer), $N_B$ a base layer of N-type conductivity forming a first PN junction $J_1$ with the $P_E$ layer (hereinafter referred to as the $N_B$ layer), $P_B$ a base layer of P-type conductivity forming a second PN junction $J_2$ with the $N_B$ layer (hereinafter referred to as the $P_B$ layer), and $N_E$ an emitter layer of N-type conductivity forming a third PN junction $J_3$ with the $P_B$ layer (hereinafter referred to as the $N_E$ layer). Numeral 13 shows a minor region of N-type conductivity which is formed in the $P_B$ layer with one side thereof exposed to the main surface 12 and isolated from the $N_E$ layer by the $P_B$ layer, and numeral 14 a protrusion projected from the $N_E$ layer toward the minor region 13, the minor region 13 and the protrusion 14 being geometrically isolated by the $P_B$ layer from each other. Numerals 2 and 3 show main electrodes in ohmic contact with the $P_E$ and $N_E$ layers respectively at the main surfaces 11 and 12, and numeral 4 a gate electrode provided on the main surface 12 opposedly to the minor region 13. Numeral 5 shows an annular conductor formed on the $P_B$ layer in such a manner as to surround the $N_E$ layer in spaced relationship therewith, which conductor is in contact with both the protrusion 14 and the other side of the minor region 13 as viewed from the gate electrode 4.

Explanation will be made now of the turn-on operation of the semiconductor controlled rectifying device having the above-mentioned construction. In the forward blocked state where a voltage is applied between the main electrodes 2 and 3 in such a manner that the main electrode 2 is higher in potential than the main electrode 3, a gate voltage is applied between gate electrode 4 and main electrode 3 thereby to make gate current flow from gate electrode 4 to minor region 13. The 4-layer region with the minor region 13 as the outermost layer is turned on. Part of the load current caused by the turning on of the 4-layer region flows through the conductor 5 and protrusion 14 into the main electrode 3. In the process, a voltage for making a positive potential of the conductor 5 is produced between the conductor 5 and main electrode 3 by a voltage drop due to the resistance of the protrusion 14. When the load current flowing in the minor region 13 is increased to a point where the voltage generated between the conductor 5 and the main electrode 3 exceeds the built-in voltage of the PN junction $J_3$ formed between the $N_3$ and $P_B$ layers, part of the load current is led through the conductor 5 to the periphery of $N_E$ layer and functions as a gate current for $N_E$ layer. As a result, the entire periphery of the $N_E$ layer opposed to the conductor 5 begins to be turned on.

Figure 1A:
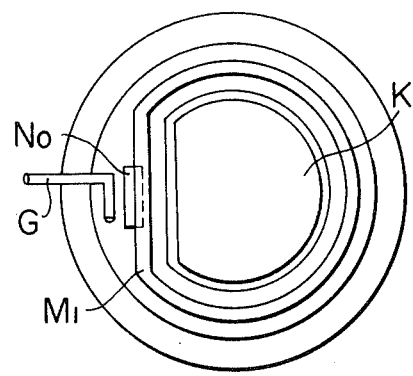
FIGS. 1a and 1b show a plan view and a sectional view respectively of a semiconductor controlled rectifying device employing the well-known amplifying gate system.
Figure 1B:
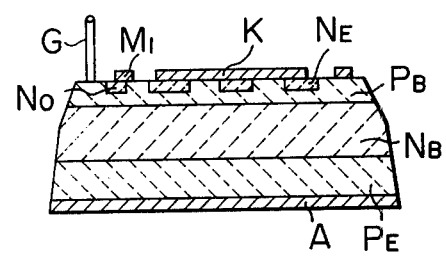
Figure 2A:
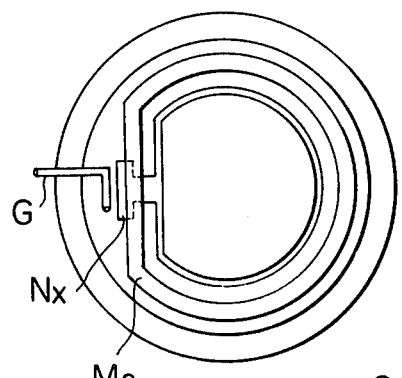
FIGS. 2a and 2b are a plan view and a sectional view respectively showing a semiconductor controlled rectifying device employing the well known regenerative gate system.
Figure 2B:
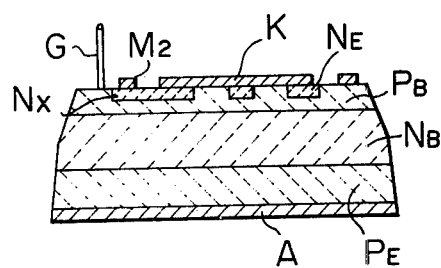

In this construction, that side of the fourth PN junction $J_4$ between the minor region 13 and the $P_B$ layer which is farther from the gate electrode 4 is short-circuited uniformly by the conductor 5, and therefore it is possible to eliminate the lack of uniformity of the energized portions in the initial stage of turning on that is the disadvantage of the regenerative gate system mentioned with reference to FIG. 2, thus permitting a small gate current to turn on uniformly the part of the minor region 13 facing the gate electrode 4. Further, in view of the fact that the conductor 5 provided around the $N_E$ layer is in contact with an end of the protrusion 14 projected from the $N_E$ layer, displacement current or reverse leakage current generated along the periphery of the conductor 5 and flow through the protrusion 14 to the main electrode 3, thus overcoming the problem of erroneous turning on due to the reduction in the capability of voltage increasing rate $dV/dt$ and high temperatures that is a shortcoming of the amplifying gate system described with reference to FIG. 1. Furthermore, since the minor region 13 is uniformly turned on by small gate current so that the resulting load current turns on the $N_E$ layer, thermal destruction of the device is prevented which otherwise might occur with the turning on limited to the minor region of the device is turned on by an inductive current (which is usually very small) generated in the gate circuit by induction. Moreover, since there apears no thermal deterioration based upon the turning on of limited part of the device which otherwise might result from displacement current, reverse leakage current and induction, the stable characteristics may always be maintained. Also, since the capability of voltage increasing rate $dV/dt$ is improved, the breakover does not take place even if an excess voltage somewhat higher than the rated voltage is applied to the device. The above-mentioned facts can give high reliability to the device.

It will be noted from the above description that it is possible according to the present invention to produce a semiconductor controlled rectifying device capable of achieving the aforementioned objects.

Figure 4:
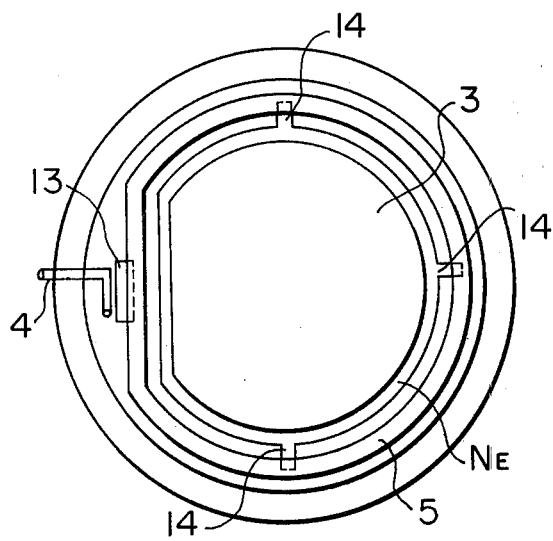
FIG. 4 is a plan view showing a second embodiment of the invention.

The semiconductor controlled rectifying device according to a second embodiment is shown in FIG. 4. This embodiment is different from the first embodiment in that, instead of the single protrusion 14 projected from the $N_E$ layer toward the minor region 13, a plurality of protrusions, or 3 in the case of the device shown in the drawing, in spaced relationship with each other are arranged at given points on the periphery of the $N_E$ layer and brought into contact with the conductor 5. In this arrangement, the displacement current or reverse leakage current or load current flowing into the conductor 5 is divided by the protrusions before reaching a main electrode. As a result, the lack of uniformity in the characteristics of the periphery of the $N_E$ layer which otherwise might occur due to causes attributable to the voltage drop in the conductor 5 is obviated, thus providing a semiconductor controlled rectifying device superior to the first embodiment for achieving the objects of the invention.

The semiconductor controlled rectifying device shown in FIG. 5 is a third and ideal embodiment of the invention. The construction of this embodiment is such that it comprises an annular minor region 13 formed in the $P_B$ layer in spaced relationship with the $N_E$ layer, an annular conductor 5 provided on that portion of $P_B$ layer surrounding the $N_E$ layer and on the periphery of the minor region 13, and a gate electrode 4 surrounded by the minor region 13 on the $P_B$ layer. The conductor 5 is in contact with the protrusion 14 projected from the $N_E$ layer. In this case, the rate at which the PN junction between the inner periphery of minor region 13 and the $P_B$ layer is forward-biased in response to gate current should preferably be equalized by equalizing the distance from the gate electrode 4 to the inner periphery of the minor region 13, or by equalizing the distance from the outer periphery of the minor region 13 to the gate electrode 4. According to this arrangement, the entire gate current contributes to the turning on of the minor region 13, that part of the minor region facing the gate electrode is uniformly turned on, and the fact that the surface of $P_B$ layer around the gate electrode is covered by the conductor permits a uniform capability of voltage increasing rate $dV/dt$ of the particular main surface of the device involved, thereby making this embodiment most preferable in achieving the objects of the invention.

The diagram of FIG. 6 shows the semiconductor controlled rectifying device according to a fourth embodiment of the invention which is an application of the invention to a device with a smaller current capacity than the preceding embodiments.

The embodiment under consideration is so constructed that the conductor 5 is arranged to surround part of the $N_E$ layer, so that the part of the $N_E$ layer not facing the conductor 5 has on it the main electrode 3 extending beyond the periphery of the $N_E$ layer on the $P_B$ layer. The area of the $N_E$ layer which is first turned on is proportional to the length along which the conductor 5 faces the $N_E$ layer. For this reason, in the event that a small current capacity and a low operating frequency are involved and an initially turned on area need not be large, portions of the conductor 5 and the periphery of $N_E$ layer in opposed relationship may be accordingly reduced. The problem in this case, however, is the erroneous turning on of the device which may occur at the part of the periphery of the $N_E$ layer not facing the conductor 5 at a high voltage increasing rate $dV/dt$ or high temperature. This problem is overcome in the present embodiment in such a manner that part of the main electrode 3 under which the periphery of the $N_E$ layer is not in opposed relationship with the conductor 5 is extended beyond the $N_E$ layer onto the surface of $P_B$ layer. Thus the embodiment under consideration successfully achieves the objects of the invention as the preceding embodiments.

In a fifth embodiment of the invention illustrated in FIG. 7, the part of the periphery of the $N_E$ where the protrusion is formed in the preceding embodiments is reduced in thickness segmentally to form an equivalent protrusion.

A sixth embodiment of the invention is shown in FIG. 8. The semiconductor controlled rectifying device according to this embodiment is such that the conductor 5 comprises a first conductor portion 51 in contact with the protrusion 14 projected from the $N_E$ layer surrounded by the conductor portion 51 in spaced relation therewith, a second conductor portion 52 in contact with both the side of the minor region 13 farther from the gate electrode 4 and the $P_B$ layer, and a lead wire 53 for connecting the conductor portions 51 and 52. This embodiment is suitable to other than a circular substrate 1 from the viewpoint of its utilization rate.

The present invention is not limited to the above-described embodiments but may be modified in various ways. For example, the conductivity of the aforementioned devices may be reversed, the conductor 5 may be engaged with the $N_E$ layer, the gate electrode may be brought into rectifying contact with the $P_B$ layer, the gate electrode may be formed on the minor region, and the gate electrode may be replaced by gate means making use of radiation of light or electromagnetic wave or mechanical stress.

Preferably, the resistance of the protrusions included in the above-mentioned semiconductor controlled rectifying devices ranges from 0.04 to 0.30. At a high resistance of the protrusions, the capability of $di/dt$ is increased but the capability of $dV/dt$ is reduced at the time of turn on. When a small resistance of the protrusions is involved, on the other hand, $di/dt$ and $dV/dt$ at the time of turning on is reduced and increased respectively. This is attributable to the fact that if the resistance of the protrusions is high, the load current generated by the turning on of the 4-layer region with the minor region 13 as the outermost layer does not flow to the main electrode 3 through the protrusions but functions in its entirety as a gate current for the 4-layer region with the $N_E$ layer as the outermost layer, while it is difficult for the displacement current and reverse leakage current to flow to the main electrode 3 through the protrusions. Therefore, if both the capability of $dt/dt$ at the time of turning on and the capability of $dV/dt$ in cut-off state are to be appropriately high, the resistance value of the protrusions must be in a certain preferable range. The result of the inventors' experiment, which has been conducted on the conditions of the capability of $dV/dt$ of 3000V/$\mu$s or more and capability of $di/dt$ of 500A/$\mu$s or more, shows that the optimum range of the resistance value of the protrusions is from 0.04 to 0.3$\Omega$. Notwithstanding, this criteria does not apply when only one instead of both of the capabilities of $dV/dt$ and $di/dt$ is desired to be high.

The invention will be explained by reference to actual figures involved in a typical case. The thyristor according to the present invention as shown in FIG. 3 has been compared with the thyristors of the amplifying gate system of FIG. 1 and the regenerative gate system of FIG. 2, each involving 2500V, 400A, 6mm in length by which the gate electrode is opposed to the minor region, and 15 cm in length by which the conductor is opposed to the $N_E$ layer. As a result of comparison between the capability of voltage increasing rate $dV/dt$ of the amplifying gate system and that of the invention, it has been found that the upper limit of the capability of $dV/dt$ is 200V/$\mu$s to 300V/$\mu$s for the former and 3000V/$\mu$s for the latter. When the gate current required to turn on the minor region uniformly has been compared between the regenerative gate system and the present invention, more than 2A is required for the former while it is only 0.5A required for the latter.

It will thus be seen that according to the invention a semiconductor controlled rectifying device is obtained which is capable of being turned on with a small gate current and high in the capability of the voltage increasing rate $dV/dt$.

What is claimed is:

1. A semiconductor controlled rectifying device comprising:
    a semiconductor substrate including
        a first layer of a first conductivity type,
        a second layer having a second conductivity type, opposite said first conductivity type, and forming a first PN junction with said first layer adjacent thereto,
        a third layer having said first conductivity type and forming a second PN junction with said second layer adjacent said third layer,
        a fourth layer having said second conductivity type and forming a third PN junction with said third layer, said fourth layer being buried in said third layer with its surface exposed, and
        a fifth layer in ring form isolated from said fourth layer by said third layer and buried in said third layer with its surface exposed, said fifth layer forming a fourth PN junction with said third layer and having said second conductivity type, said fifth layer having a smaller area than said fourth layer;
    a first main electrode in ohmic contact with at least the surface of said first layer;
    a second main electrode in ohmic contact with at least the surface of said fourth layer;
    a gate electrode in contact with that part of the surface of said third layer which is surrounded by said fifth layer; and
    a conductor disposed on and in contact with both said third and fifth layers, that part of said conductor disposed on said third layer extending along the periphery of said fourth layer spaced-apart from the periphery thereof by constant distance and a portion of said part of said conductor being in contact with said periphery of said fourth layer.

2. A semiconductor controlled rectifying device according to claim 1, in which said part of said conductor surrounds the periphery of said fourth layer.

3. A semiconductor controlled rectifying device comprising:
    a semiconductor substrate having first and second surfaces opposite one another and including
        a first semiconductor layer of a first conductivity type one surface of which forms said first surface of said substrate,
        a second semiconductor layer of a second conductivity type, opposite said first conductivity type, disposed on said first semiconductor layer and defining a first PN junction therewith;
        a third semiconductor layer of said first conductivity type, disposed on said second semiconductor layer and defining a second PN junction therewith, one surface of said third semiconductor layer extending to and forming said second surface of said substrate,
        a first semiconductor region of said second conductivity type disposed in a first surface portion of said third semiconductor layer, and defining a third PN junction therewith, and
        a second semiconductor region of said second conductivity type disposed in a second surface portion of said third semiconductor layer and defining a fourth PN junction therewith, and being spaced apart from said first semiconductor region by the semiconductor material of said third semiconductor layer therebetween.

a first main electrode disposed in ohmic contact with said first surface of said substrate;

a second main electrode disposed in ohmic contact with said first semiconductor region at said second surface of said substrate;

a gate electrode disposed in ohmic contact with a third surface portion of said third semiconductor layer, and being spaced apart from said second semiconductor region by the semiconductor material of said third semiconductor layer therebetween, said second surface portion of said third semiconductor layer being disposed between the first and third surface portions thereof; and a conductive layer disposed on said second surface of said substrate so as to be in ohmic contact with said second semiconductor region and said third semiconductor layer while extending along and being spaced apart by a constant degree from the periphery of said first semiconductor region except at at least one prescribed reduced portion thereof where said first semiconductor region and said conductor layer protrude relatively toward each other and are contiguous with each other; and wherein said first semiconductor region protrudes toward and is contiguous with said conductor layer at a surface portion of said substrate diametrically opposed to said second surface portion of said substrate relative to said second main electrode which is disposed therebetween; and wherein said second semiconductor region is annularly shaped and surrounds the third surface portion of said substrate upon which said gate electrode is disposed and said conductor layer is contiguous with the entire periphery of said annularly shaped second semiconductor region and further surrounds said second main electrode.

* * * * *